(12) United States Patent
Ratnakumar et al.

(10) Patent No.: US 8,530,976 B1
(45) Date of Patent: Sep. 10, 2013

(54) MEMORY ELEMENT TRANSISTORS WITH REVERSED-WORKFUNCTION GATE CONDUCTORS

(75) Inventors: Albert Ratnakumar, San Jose, CA (US); Qi Xiang, San Jose, CA (US); Jun Liu, Milpitas, CA (US)

(73) Assignee: Altera Corporation, San Jose, CA (US)

( * ) Notice: Subject to any disclaimer, the term of this patent is extended or adjusted under 35 U.S.C. 154(b) by 189 days.

(21) Appl. No.: 13/113,896

(22) Filed: May 23, 2011

(51) Int. Cl.
*H01L 21/70* (2006.01)

(52) U.S. Cl.
USPC .......................................... 257/407; 257/369

(58) Field of Classification Search
USPC ................................................ 257/369, 407
See application file for complete search history.

(56) References Cited

U.S. PATENT DOCUMENTS

| | | | |
|---|---|---|---|
| 5,517,452 A | 5/1996 | Mehalal | |
| 6,934,181 B2 | 8/2005 | Chu et al. | |
| 7,307,907 B2 | 12/2007 | Houston | |
| 7,782,655 B2 | 8/2010 | Shau | |
| 8,283,734 B2 * | 10/2012 | Chiang et al. | 257/407 |
| 2006/0019437 A1 * | 1/2006 | Murto et al. | 438/199 |
| 2011/0097885 A1 * | 4/2011 | Bhalla et al. | 438/589 |

* cited by examiner

*Primary Examiner* — Douglas Menz
(74) *Attorney, Agent, or Firm* — Treyz Law Group; G. Victor Treyz; Michael H. Lyons

(57) ABSTRACT

Integrated circuits may be provided that include memory elements that produce output control signals and corresponding programmable logic circuitry that receives the output control signals from the memory elements. The memory elements may include bistable storage elements formed from circuits such as cross-coupled inverters. The inverters may include n-channel metal-oxide-semiconductor transistors with p-metal gate conductors and n-channel metal-oxide-semiconductor transistors with p-metal gate conductors. These gate conductor assignments are the reverse of the gate conductor assignments used in the n-channel and p-channel transistors in other circuitry such as the programmable logic circuitry. The reversed gate conductor assignments increase the threshold voltages of the transistors in the memory elements to improve reliability in scenarios in which the memory elements are overdriving pass transistors in the programmable logic circuitry.

17 Claims, 5 Drawing Sheets

MEMORY ELEMENT TRANSISTORS WITH REVERSED-WORKFUNCTION GATE CONDUCTORS

BACKGROUND

This relates generally to integrated circuits and more particularly, to integrated circuits such as programmable integrated circuits with memory elements.

Integrated circuits often include memory. For example, random-access memory can be used to store data during processing operations. In programmable integrated circuits, random-access memory is sometimes used to store configuration data. In this context, the random-access memory is often referred as configuration random-access memory (CRAM). The outputs of CRAM cells on a programmable integrated circuit are applied to pass transistors in programmable logic circuits. The data that is loaded into the CRAM cells configures the programmable logic circuits to perform custom logic functions by turning on and off appropriate pass transistors.

To ensure that pass transistors can be fully turned on and therefore operate at high speeds, some programmable integrated circuits power CRAM cells at elevated voltages. The resulting elevated control signals that are supplied at the outputs of the CRAM cells can be used to overdrive their associated pass transistors and thereby ensure that the pass transistors are fully on.

This type of scheme generally requires that the transistors that make up the CRAM cells be fabricated with thickened gate oxides relative to the pass transistors and other logic transistors. The thickened gate oxides ensure that the CRAM transistors will operate reliably, but may involve undesired process complexity.

SUMMARY

Integrated circuits may be provided that include memory elements that produce output signals and corresponding programmable logic circuits that receive control signals from the memory elements.

The memory elements may include bistable storage elements formed from circuits such as cross-coupled inverters. Address transistors may be used to access the contents of the bistable storage elements.

The inverters may include n-channel metal-oxide-semiconductor transistors with p-metal gate conductors and p-channel metal-oxide-semiconductor transistors with n-metal gate conductors. These gate conductor assignments are the reverse of the gate conductor assignments used in the n-channel and p-channel transistors in other circuitry such as the programmable logic circuitry. The n-metal gate conductors may exhibit a workfunction of 4.1 to 4.5 eV. The p-metal gate conductors may exhibit a workfunction of about 4.9 to 5.3 eV.

The reversed gate conductor assignments increase the threshold voltages of the transistors in the memory elements to improve reliability in scenarios in which the memory elements are overdriving pass transistors in the programmable logic circuitry.

Further features of the present invention, its nature and various advantages will be more apparent from the accompanying drawings and the following detailed description.

DETAILED DESCRIPTION

This relates to integrated circuits such as integrated circuits that contain memory elements. The integrated circuits may include digital signal processing circuits, microprocessors, application specific integrated circuits, memory chips, programmable logic device integrated circuits or other programmable integrated circuits, or any other suitable integrated circuits.

Programmable integrated circuits such as programmable logic device integrated circuits use programmable memory elements to store configuration data. During programming operations of a programmable integrated circuit, configuration data is loaded into the memory elements. During normal operation of the programmable integrated circuit, each memory element provides a static output signal. The static output signals that are supplied by the memory elements serve as control signals. These control signals are applied to programmable logic on the integrated circuit to customize the programmable logic to perform a desired logic function.

Figure 1:
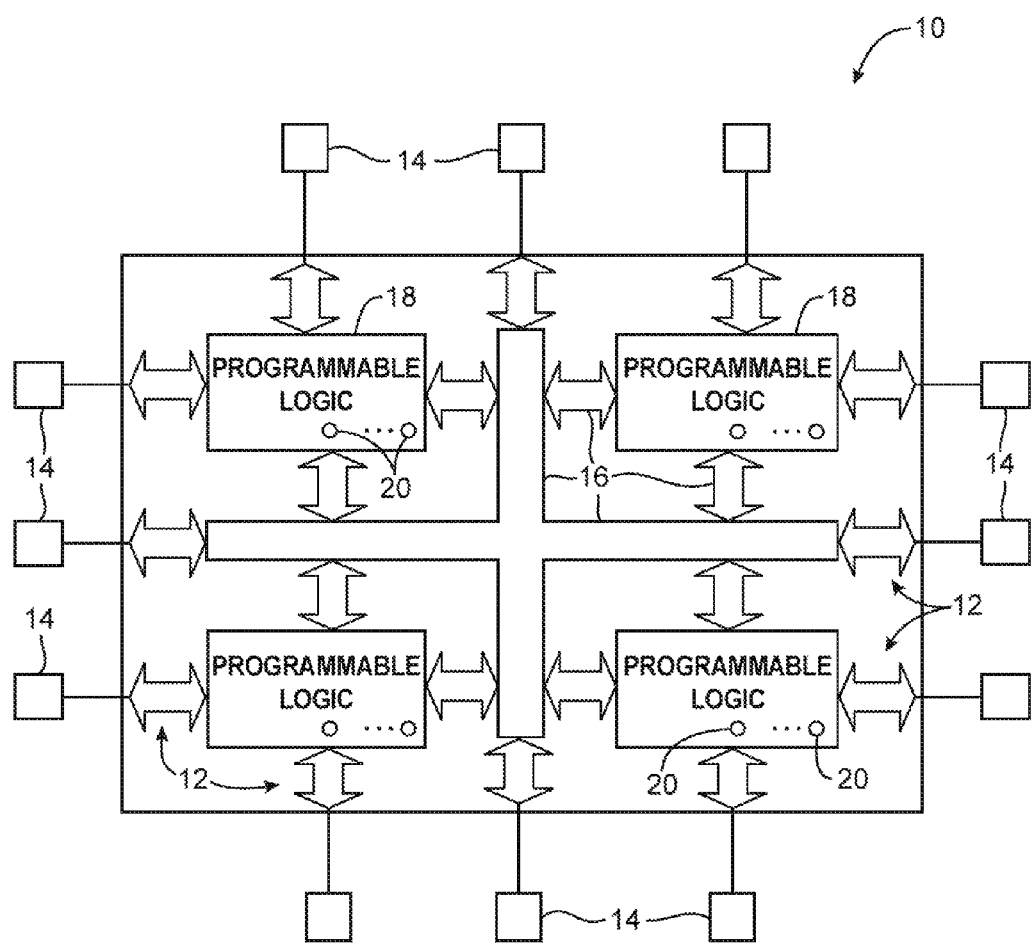
FIG. 1 is a diagram of an illustrative integrated circuit of the type that may contain memory cells with reversed-workfunction gate conductors in accordance with an embodiment of the present invention.

Memory elements, which are sometimes referred to as storage elements or memory bits, may be organized in arrays having numerous rows and columns. For example, memory array circuitry may be formed in hundreds or thousands of rows and columns on a programmable logic device integrated circuit. Programmable integrated circuit 10 of FIG. 1 is an example of an illustrative integrated circuit on which memory array circuitry may be formed. Programmable integrated circuit 10 may be formed form a silicon substrate or other suitable semiconductor substrate.

As shown in FIG. 1, programmable integrated circuit 10 may have input-output (I/O) circuitry 12 for driving signals off of device 10 and for receiving signals from other devices via input-output pins 14. Interconnection resources 16 such as global and local vertical and horizontal conductive lines and buses may be used to route signals on device 10. Interconnection resources 16 include fixed interconnects (conductive lines) and programmable interconnects (i.e., programmable connections between respective fixed interconnects). Programmable logic 18 may include combinational and sequential logic circuitry. The programmable logic 18 may be configured to perform a custom logic function.

Programmable integrated circuit 10 contains memory elements 20 that can be loaded with configuration data (also called programming data) using pins 14 and I/O circuitry 12. Once loaded, the memory elements each provide a corresponding static control output signal that controls the state of an associated logic component in programmable logic 18.

Typically the memory element output signals are used to control the gates of metal-oxide-semiconductor (MOS) transistors. Some of the transistors may be p-channel metal-oxide-semiconductor (PMOS) transistors (e.g., PMOS transistors that are used as part of a power-down circuit, etc.). Many of the transistors will generally be n-channel metal-oxide-semiconductor (NMOS) pass transistors in programmable components such as multiplexers. When a memory element output is high, an NMOS pass transistor controlled by that memory element will be turned on to pass logic signals from its input to its output. When the memory element output is low, the pass transistor is turned off and does not pass logic signals.

A typical memory element 20 is formed from a number of transistors configured to form cross-coupled inverters. Other arrangements (e.g., cells with more distributed inverter-like circuits) may also be used. With one suitable approach, complementary metal-oxide-semiconductor (CMOS) integrated circuit technology is used to form the memory elements 20, so CMOS-based memory element implementations are described herein as an example. In the context of programmable integrated circuits, the memory elements store configuration data and are therefore sometimes referred to as configuration random-access memory (CRAM) cells.

Figure 2:
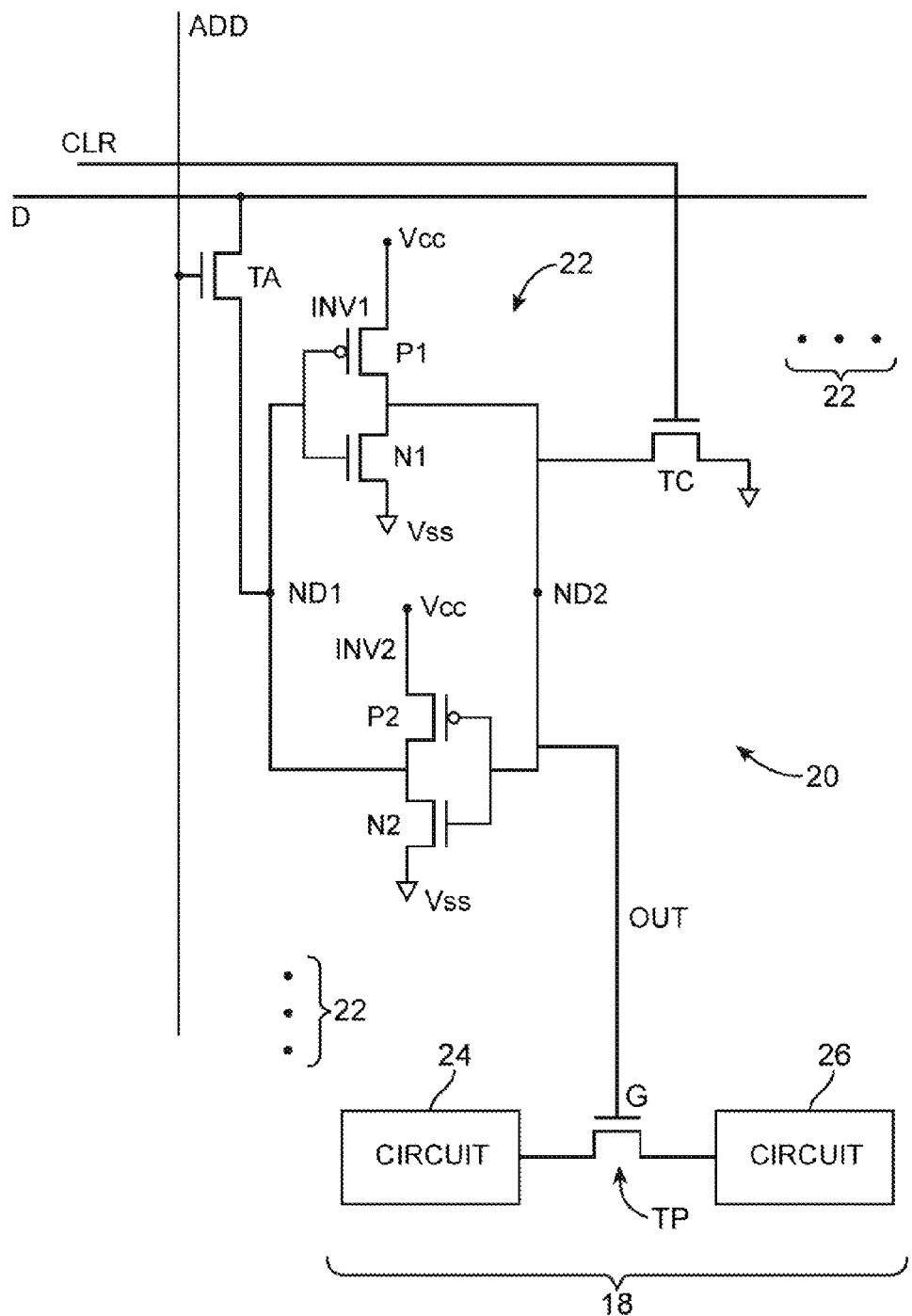
FIG. 2 is a circuit diagram of a memory cell of the type that may be provided with reversed-workfunction gates in accordance with an embodiment of the present invention.

FIG. 2 is a diagram of an illustrative memory element (e.g., a CRAM cell) on integrated circuit 10. As shown in FIG. 2, memory element 20 may form part of a larger array of memory elements (see, e.g., dots 22). Memory element 20 contains a bistable storage element 22. Bistable storage element 22 in the FIG. 2 example is formed from cross-coupled inverters INV1 and INV2. In other types of memory cells such as memory cells that provide enhanced immunity to soft error upset (SEU) events, bistable storage elements may be implemented using four interconnected inverter-like circuits or other circuitry. The arrangement of FIG. 2 in which bistable element 22 is formed from cross-coupled inverters is merely illustrative.

Inverter INV1 has a p-channel metal-oxide-semiconductor (PMOS) transistor P1 and an n-channel metal-oxide-semiconductor (NMOS) transistor N1 coupled in series between positive power supply voltage Vcc and ground power supply voltage Vss. Inverter INV2 has PMOS transistor P2 and NMOS transistor N2 coupled in series between positive power supply terminal Vcc and ground power supply terminal Vss. Inverters INV1 and INV2 are said to be cross-coupled, because the output of inverter INV1 is connected to the input of inverter INV2 while the output of inverter INV2 is coupled to the input of inverter INV1.

Bistable storage element 22 has first node ND1 (at the input to inverter INV1) and second node ND2 (at the input of inverter INV2) for storing data. The states of nodes ND1 and ND2 are complementary. For example, if a logic "1" is present on node ND1, a logic "0" will be stored on node ND2, whereas storage of a logic "1" on node ND2 is associated with the presence of a logic "0" on node ND1. By convention, the value of the data bit on node ND2 is typically used to the represent the contents of memory element 20.

Upon power-up or during subsequent clear operations, it may be desirable to clear memory elements such as memory element 20. This may be accomplished by asserting clear control line CLR, turning on clear transistor TC and taking node ND2 to "0" (i.e., clearing memory element 20 by placing a "0" on node ND2).

During data loading operations, data (a "1" or a "0") is placed on data line D while an address signal is asserted on address line ADD. When the address line goes high, address transistor TA is turned on and the data present on line D is driven onto node ND1. If, for example, line D is high, a "1" will be driven onto node ND1 and node ND2 will be taken to a "0" value (i.e., a "0" will be loaded into memory element 20). If line D is low when the address signal is asserted, node ND1 will be driven low and N2 will be loaded with a "1". If desired, other addressing and clearing schemes may be used in memory element 20 (e.g., using differential data lines, differential address lines, etc.). The illustrative arrangement of FIG. 2 is merely an example.

Output line OUT is coupled to the gate G of pass transistor TP. Pass transistors such as pass transistor TP form part of programmable circuitry 18 on integrated circuit 10. Circuitry 18 may include registers and more complex memory circuits, logic gates, multipliers, processing blocks, and other circuitry (sometimes referred to as core logic, core circuitry, programmable circuitry, programmable logic circuitry, or logic circuitry).

The contents of memory element 20 controls the state of pass transistor TP. If a "0" is stored in memory element 20 on node ND2, transistor TP will be off and signals will be prevented from passing from circuit 24 to circuit 26. If a "1" is stored in memory element 20 on node ND2, transistor TP will be on and signals will be able to pass from circuit 24 to circuit 26. By configuring all appropriate memory elements 20 in the memory array on integrated circuit 10 (e.g., by configuring tens to millions of different memory elements or more), circuitry 18 may be configured ("programmed") to form a desired custom circuit.

In conventional programmable integrated circuits, CRAM cells are sometimes powered using elevated positive power supply voltages (i.e., positive power supply voltages that are larger than the positive power supply voltages used for powering core logic circuitry elsewhere on the integrated circuit). The use of an elevated power supply for the CRAM cells ensures that the CRAM cells provide logic "1" outputs at overdrive levels to the gates of their associated pass transistors, thereby forcefully turning the pass transistors on to maximize the speed of those pass transistors. To ensure that the CRAM cells are sufficiently reliable, the transistors in the inverters of the CRAM cells are provided with gate oxides that are thicker than the gate oxides in the transistors of the core logic circuitry. The use of thickened oxides for the CRAM cell transistors tends to increases process complexity and may therefore add to device cost.

Another way to overdrive transistors such as pass gate TP of FIG. 2 involves lowering the threshold voltage Vt for pass transistors TP (e.g., to a lower value of 0.3 volts or 0.2 volts instead of a value of 0.4 volts). When this type of lowered Vt value is used for the pass transistors, an output of about 1 volt on output line OUT (which may be produced by using a Vcc value of 1 volt in memory element 20 of FIG. 2), will tend to overdrive pass transistors TP and will help ensure that pass transistor TP does not slow signals passing from circuit 24 to circuit 26 in programmable circuitry 18. Other values may be used for the threshold voltage Vt of transistors such as pass transistor TP and the power supply voltage Vcc. These are merely illustrative examples.

In a configuration in which Vt is lowered to 0.2 or 0.3 volts and Vcc is set to 1.0 volts in memory element (as an example), it may be desirable to power memory element 20 with a Vss value of less than 0 volts (e.g., a ground value Vss of −0.2 volts). With this type of arrangement, the output voltage on line OUT of FIG. 2 will range from 1.0 volts (turning transistor TP strongly on) to −0.2 volts (turning transistor TP strongly off and avoiding undesirable leakage currents).

The use of a negative voltage to power terminals Vss in memory element 20 while maintaining Vcc constant or the use of other overdrive schemes, will result in a rail-to-rail voltage in memory element 20 that is elevated. For example, in a scenario in which OUT ranges from 1.0 volts (when node ND2 is high) to −0.2 volts (when node ND2 is low), memory element 20 will experience a rail-to-rail voltage swing of 1.2 volts (Vcc-Vss). This is larger than the normal power supply voltage (e.g., a positive power supply voltage of 1 volt and a ground power supply voltage of 0 volts) that is used in powering circuitry 18. As a result, the transistors of memory element 20 (e.g., transistors P1, N1, P2, and N2) will be subject to elevated voltage swings compared to the voltage swings experienced by the logic transistors in circuitry 18.

To ensure that the memory element transistors exhibit satisfactory reliability without requiring the use of thickened gate oxide layers, the transistors of memory element 20 (e.g., transistors P1, N1, P2, and N2) may be formed using gate conductors with workfunctions that increase the threshold voltages for the transistors to an elevated level. For example, if transistors such as transistor TP have a threshold voltage of 0.3 volts (as an example), the threshold voltage of transistors P1, N1, P2, and N2 of memory element 20 may have a threshold voltage of 1.2 volts (e.g., 1.0 to 1.4 volts or 0.9 to 1.5 volts, as examples). Memory element 20 may then be powered with a voltage of about 1.0 volts (as an example).

In this configuration, the transistors of memory element 20 operate in a "subthreshold" regime, characterized by increased reliability and somewhat slower switching speeds. Although switching speed and therefore the speed of reading data from memory element 20 and writing data to memory element 20 may be slowed somewhat by operating the transistors of memory element 20 in the subthreshold regime, this is generally acceptable, because programmable integrated circuit 10 of FIG. 1 generally does not need to be frequently loaded with data. Rather, data loading (and reading to verify correct programming) tends to take place only occasionally over the life of an integrated circuit.

To adjust the threshold voltage by proper configuration of the workfunctions of the gate conductors, NMOS transistors N1 and N2 may be provided with the type of metal gates (sometimes referred to as p-metal gates or PMGs) that are normally used for PMOS transistors, whereas PMOS transistors P1 and P2 may be provided with the type of metal gates (sometimes referred to as n-metal gates or NMGs) that are normally used for NMOS transistors. Swapping the gate conductor assignments in this way generally avoids the need to increase the gate oxide thickness of the memory element transistors and may not involve excessive process complexity, because the PMGs that are used as metal gates for NMOS transistors N1 and N2 are preferably already used elsewhere on integrated circuit 10 (e.g., in circuitry 18) for forming PMOS gates and because the NMGs that are used as metal gates for PMOS transistors P1 and P2 are preferably already used elsewhere on integrated circuit 10 (e.g., in circuitry 18) for forming NMOS gates.

Figure 3:
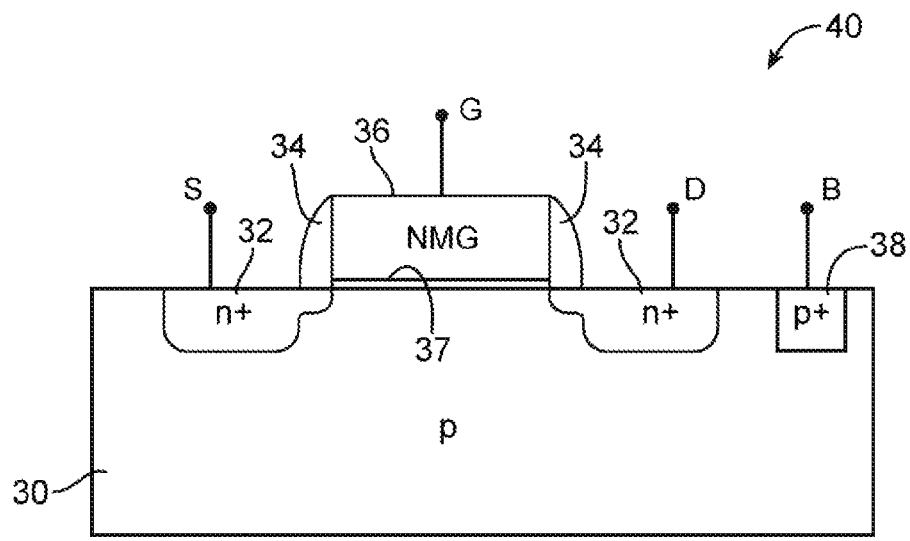
FIG. 3 is a cross-sectional side view of a conventional n-channel metal-oxide-semiconductor transistor of the type that may be used in the integrated circuit of FIG. 1.

A cross-sectional side view of a conventional NMOS transistor is shown in FIG. 3. As shown in FIG. 3, NMOS transistor 40 has four terminals: source S, drain D, body B, and gate G. Transistor 40 may be formed from p-type body region 30. P+ region 38 may be used to form an ohmic contact for body terminal B. N+ regions 32 are associated with source terminal S and drain terminal D. Oxide spacers 34 may be formed adjacent to gate conductor 36. Gate conductors 36, which is formed on gate insulator 37, is used to form gate terminal G. The material that is used to make up gate conductor 36 may be, for example, n-type polysilicon or a compound of aluminum, titanium, and nitrogen or any other suitable conductive compound that has a workfunction substantially equal to that of n-type polysilicon (e.g., about 4.3 eV or about 4.1 to 4.5 eV). Because gate conductor 36 has a workfunction that is substantially equal to that of n-type polysilicon, gate conductors such as gate conductor 36 may sometimes be referred to as n-metal gates (NMGs), as shown in FIG. 3.

Figure 4:
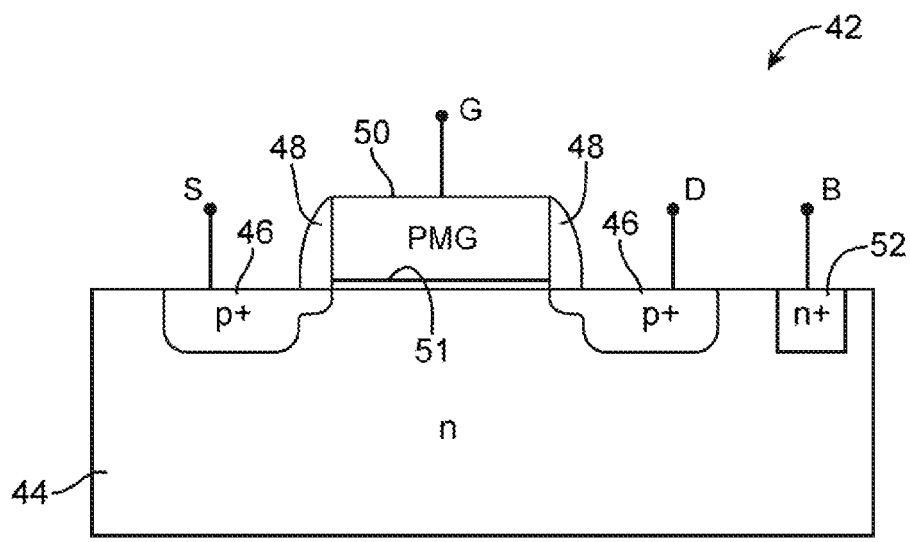
FIG. 4 is a cross-sectional side view of a conventional p-channel metal-oxide-semiconductor transistor of the type that may be used in the integrated circuit of FIG. 1.

FIG. 4 is a cross-sectional side view of a conventional PMOS transistor. As shown in FIG. 4, PMOS transistor 42 may be formed from n-type body region 44. N+ region 52 may be used to form an ohmic contact for body terminal B. P+ regions 46 are used to form source terminal S and drain terminal D. Oxide spacers 48 are located adjacent to gate conductor 50, which forms gate terminal G. Gate conductor 50 may be formed on gate insulator 51. The material that forms gate conductor 50 may be, for example, p-type polysilicon or a compound of aluminum, titanium, and nitrogen or other suitable conductive compound that has a workfunction of p-type polysilicon (e.g., about 5.1 eV or about 4.9 to 5.3 eV). Because gate conductor 50 has a workfunction that is substantially equal to that of p-type polysilicon, gate conductors such as gate conductor 50 may sometimes be referred to as p-metal gates (PMGs), as shown in FIG. 4.

In a typical arrangement, conventional NMOS and PMOS transistors such as transistors 40 and 42 of FIGS. 3 and 4 may be fabricated with threshold voltages of about 0.3 to 0.4 volts. When used in forming memory elements (e.g., when used in forming cross-coupled inverters), conventional transistors such as these may be powered using positive power supply voltages of about 1.0-1.5 volts (as an example). As a result, conventional NMOS and PMOS transistors in a memory element are generally operated in the so-called superthreshold region. In contrast, memory elements such as memory elements 20 of integrated circuit 10 of FIG. 1 may be provided with gate conductor materials that cause the transistors in the memory elements to exhibit enlarged threshold voltages (e.g., Vt values of 1.2 volts). When powered using a power supply voltage of 1.0 volts, the data storage nodes ND1 and ND2 will store "1" values of 1.0 volts. This 1.0 volt level is below threshold voltage Vt (1.2 volts), so the transistors in bistable element 22 will be operated in a subthreshold regime.

Figure 5:
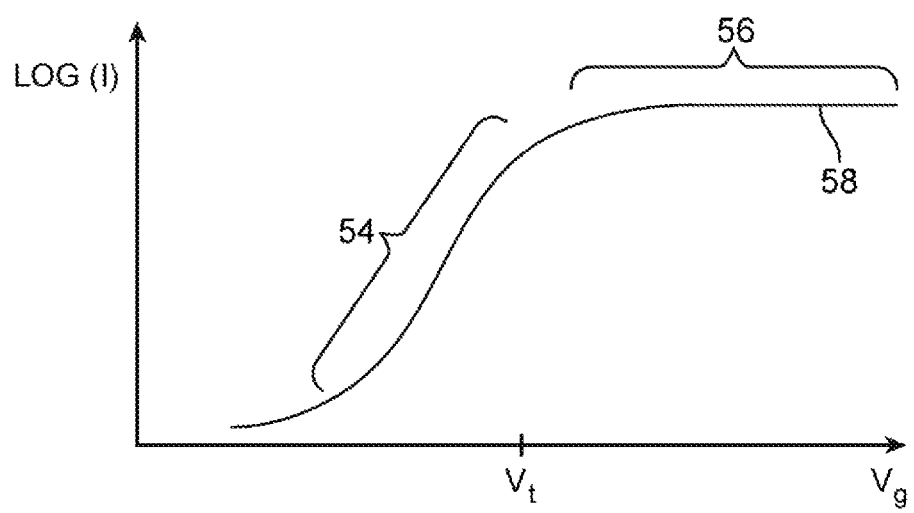
FIG. 5 is a graph in which transistor current has been plotted as a function of applied gate voltage in accordance with an embodiment of the present invention.

A graph in which current has been plotted as a function of applied gate voltage Vg for a transistor of threshold voltage Vt is shown in FIG. 5. Conventionally, CRAM cells in programmable integrated circuits are operated in superthreshold regime 56 of curve 58. Memory elements 20 of programmable integrated circuit 10 are preferably operated in subthreshold region 54.

The threshold voltage for the NMOS and PMOS transistors in bistable element 22 are preferably set at elevated levels by using gate conductor assignments that are the reverse of what is conventionally used in NMOS and PMOS transistors such as transistors 40 and 42 (i.e., the reverse of the assignments used by the NMOS and PMOS transistors in circuitry 18). For example, NMOS transistors for bistable storage element 22 may be formed using a p-metal gate conductor (PMG), whereas PMOS transistors for bistable storage element 22 in memory element 20 may be formed using an n-metal gate conductor (NMG).

Figure 6:
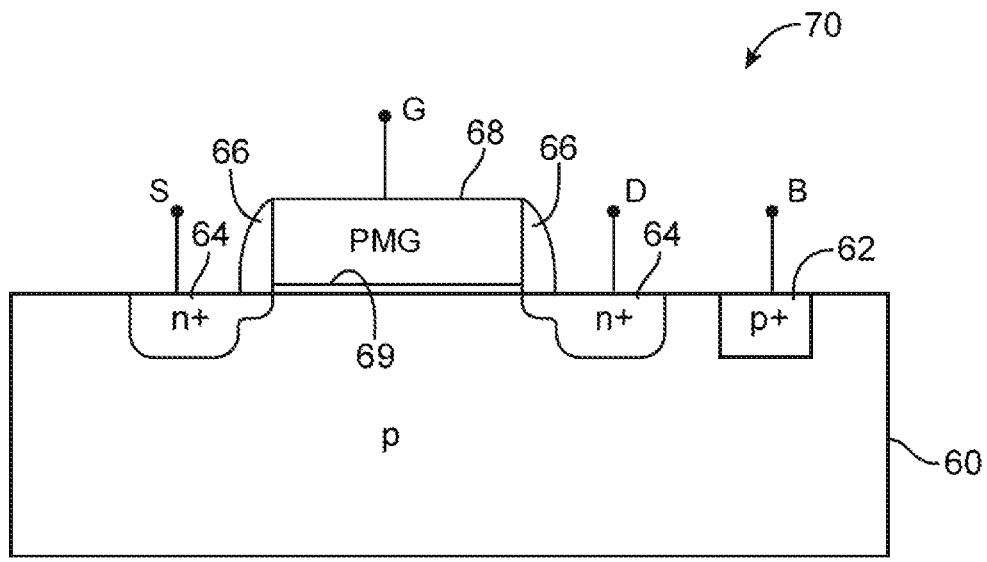
FIG. 6 is a cross-sectional side view of an illustrative n-channel metal-oxide-semiconductor transistor in accordance with an embodiment of the present invention.

An illustrative transistor configuration that may be used in implementing NMOS transistors such as transistors N1 and N2 of FIG. 2 is shown in FIG. 6. A shown in FIG. 6, transistor 70 may be formed from p-type body region 60 (e.g., a p-type silicon body region or a p-type region formed in another suitable semiconductor). P+ region 62 may be used to form an ohmic contact for body terminal B. N+ regions 64 may be used to form source terminal S and drain terminal D (sometimes collectively referred to as source-drain terminals, source-drain regions, or source-drains). Spacers 66 may be located adjacent to gate conductor 68, which forms gate terminal G. A layer of oxide or other gate insulator such as insulator layer 69 may be interposed between gate conductor 68 and p-type body region 60. The material that forms gate conductor 68 may be, for example, p-type polysilicon or a compound of aluminum, titanium, and nitrogen or other suitable conductive compound that has a workfunction matching that of p-type polysilicon (e.g., about 5.1 eV or about 4.9 to 5.3 eV).

If desired, gate conductor 68 may be formed using the PMG material that is otherwise available and being used on integrated circuit 10 in forming conventional-type PMOS transistors in circuitry 18 (e.g., PMOS transistors such as transistor 42 of FIG. 4). With this type of arrangement, gate conductor 68 may have a workfunction of about 5.1 eV. If desired, gate conductor 68 may be formed from doped polysilicon or a metal compound that has another workfunction, provided that the workfunction is greater than that for the n-metal gate material used on circuit 10 (e.g., so long as the workfunction for gate conductor 68 of FIG. 6 is greater than 4.3 eV).

Figure 7:
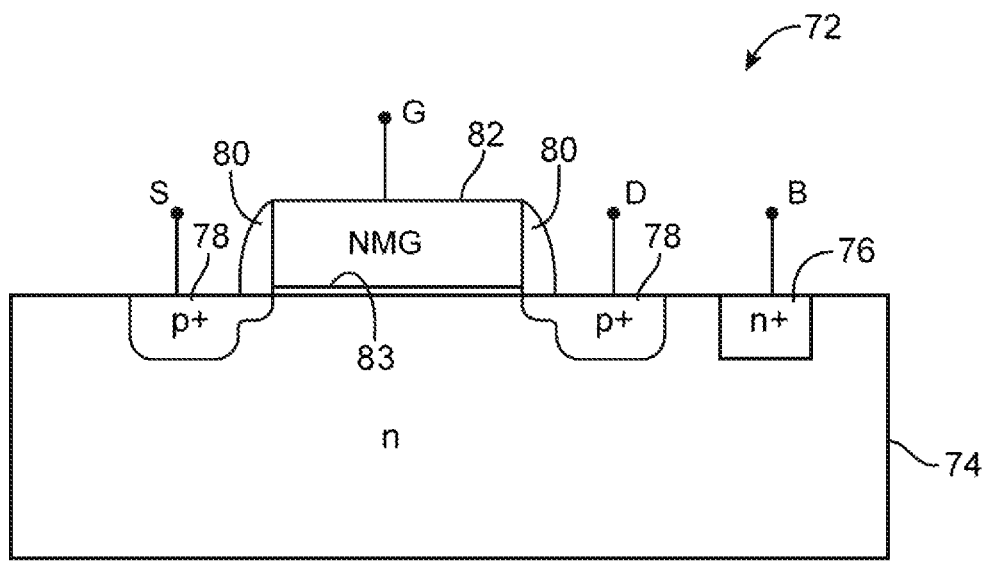
FIG. 7 is a cross-sectional side view of an illustrative p-channel metal-oxide-semiconductor transistor in accordance with the present invention.

An illustrative transistor configuration that may be used in implementing PMOS transistors such as transistors P1 and P2 of bistable element 22 in memory element 20 of FIG. 2 is shown in FIG. 7. As shown in FIG. 7, PMOS transistor 72 may be formed from n-type body region 74 (e.g., an n-type silicon body region or other suitable semiconductor). N+ region 76 may be used to form an ohmic contact for body terminal B. P+ regions 78 may be used to form source terminal S and drain terminal D (i.e., source-drain terminals). Spacers 80 may be located adjacent to gate conductor 82, which forms gate terminal G. Gate conductor 82 may be formed on top of a layer of gate oxide or other gate insulator such as insulator layer 83. The material that forms gate conductor 82 may be, for example, n-type polysilicon or a compound of aluminum, titanium, and nitrogen or other suitable conductive compound that has a workfunction matching that of n-type polysilicon (e.g., about 4.3 eV).

If desired, gate conductor 82 may be formed using the NMG material that is otherwise available and being used on integrated circuit 10 in forming conventional-type NMOS transistors in circuitry 18 (e.g., NMOS transistors such as transistor 40 of FIG. 3). With this type of arrangement, gate conductor 82 may have a workfunction of about 4.3 eV or about 4.1 to 4.5 eV. If desired, gate conductor 68 may be formed from doped polysilicon or a metal compound that has another workfunction, provided that the workfunction is less than that for the p-metal gate material used on circuit 10 (e.g., so long as the workfunction for gate conductor 82 of FIG. 7 is less than 5.1 eV).

The use of conventional polysilicon gate fabrication processes to fabricate transistors with polysilicon gates having reversed workfunctions (PMG for NMOS and NMG for PMOS) may be challenging when short gate lengths are involved, because of the difficulty in masking, etching, and depositing short gate length polysilicon gate conductors. These challenges can be overcome by using metal gate fabrication technology to form transistors 70 and 72. Metal gate fabrication techniques that may be used in forming transistors 70 and 72 include the "gate last" fabrication process, the "replacement gate" fabrication process, or the "gate first" fabrication process.

The foregoing is merely illustrative of the principles of this invention and various modifications can be made by those skilled in the art without departing from the scope and spirit of the invention.

What is claimed is:

1. An integrated circuit, comprising:
   at least one metal-oxide-semiconductor transistors with a reversed-workfunction gate conductor, wherein the at least one metal-oxide-semiconductor transistor includes at least one n-channel metal-oxide-semiconductor transistor with a p-metal gate conductor and at least one p-channel metal-oxide-semiconductor transistor with an n-metal gate conductor;
   n-channel transistors with n-metal gate conductors and p-channel transistors with p-metal gate conductors; and
   a memory element that includes the n-channel and p-channel metal-oxide-semiconductor transistors with reversed-workfunction gate conductors.

2. The integrated circuit defined in claim 1 further comprising:
   programmable logic circuitry including a pass transistor, wherein the pass transistor includes a gate that receives an output signal from the memory element, and wherein the pass transistor includes at least one of the n-channel transistors with n-metal gate conductors.

3. The integrated circuit defined in claim 1 wherein at least one of the n-metal or p-metal gate conductors comprises titanium.

4. The integrated circuit defined in claim 1 wherein the n-metal gate conductors are characterized by a workfunction of 4.1 to 4.5 eV.

5. The integrated circuit defined in claim 1 wherein the p-metal gate conductors are characterized by a workfunction of 4.9 to 5.3 eV.

6. An integrated circuit, comprising:
   logic circuitry that is powered using a nominal power supply voltage;
   a memory element that includes at least one re-channel transistor having a gate conductor with a workfunction of 4.9 to 5.3 eV and at least one p-channel transistor having a gate conductor with a workfunction of 4.1 to 4.5 eV; and
   a pass transistor that receives an overdrive voltage from the memory element, wherein the overdrive voltage is greater than the nominal power supply voltage.

7. The integrated circuit defined in claim 6, wherein the pass transistor comprises an n-channel pass transistor having a gate conductor with a workfunction of 4.1 to 4.5 eV.

8. The integrated circuit defined in claim 7 wherein the memory element has an output, the integrated circuit further comprising a conductive path coupled between the output of the memory element and the gate conductor of the n-channel pass transistor.

9. The integrated circuit defined in claim 6 wherein the memory element comprises one of a plurality of storage elements each of which includes at least two n-channel transistors having gate conductors with workfunctions of 4.9 to 5.3 eV and at least two p-channel transistors with workfunctions of 4.1 to 4.5 eV and wherein the storage elements are operable to receive configuration data and produce corresponding output signals, wherein the pass transistor comprises:
   an n-channel pass transistor having a gate conductor with a workfunction of 4.1 to 4.5 eV, wherein the gate conductor of the pass transistor receives an output signal from one of the storage elements.

10. The integrated circuit defined in claim 6 further comprising additional pass transistors having threshold voltages, wherein the n-channel and p-channel transistors have threshold voltages that are larger than the threshold voltages of the pass transistors.

11. An integrated circuit, comprising:
- a first p-channel transistor having a gate formed from an n-metal gate conductor;
- a second p-channel transistor having a gate formed from a p-metal gate conductor;
- a first n-channel transistor having a gate formed from the n-metal gate conductor;
- a second n-channel transistor having a gate formed from the p-metal gate conductor, wherein the second re-channel transistor and the first p-channel transistor form part of a memory element; and
- logic circuitry that is powered using a first positive power supply voltage, wherein the memory element is powered using a second positive power supply voltage that is greater than the first positive power supply voltage, and wherein the memory element outputs a static control signal at the second positive power supply voltage.

12. The integrated circuit defined in claim 11 wherein the n-metal gate conductor has a workfunction of 4.1 to 4.5 eV and wherein the p-metal gate conductor has a workfunction of 4.9 to 5.3 eV.

13. The integrated circuit defined in claim 11 wherein the second n-channel transistor and the first p-channel transistor form part of a bistable storage element in the memory element.

14. The integrated circuit defined in claim 13 wherein the memory element includes an output, wherein the integrated circuit includes a conductive path coupled between the output and the first n-channel transistor.

15. The integrated circuit defined in claim 11, wherein the memory element further comprises cross-coupled inverters, wherein at least one of the inverters is an inverter that includes the second n-channel transistor and that includes the first p-channel transistor.

16. The integrated circuit defined in claim 11 further comprising additional memory elements, each of which has a bistable element with at least two inverters, wherein each of the two inverters has an re-channel transistor and a p-channel transistor, wherein the second n-channel transistor forms the p-channel transistor in one of the inverters, and wherein the first p-channel transistor forms the re-channel transistor in one of the inverters.

17. The integrated circuit defined in claim 16 further comprising programmable logic coupled to the memory elements, wherein the first n-channel transistor and the second p-channel transistor form part of the programmable logic.

* * * * *